(12) United States Patent
Knopp et al.

(10) Patent No.: US 7,180,653 B2
(45) Date of Patent: Feb. 20, 2007

(54) HIGH SPECTRAL FIDELITY LASER SOURCE WITH LOW FM-TO-AM CONVERSION AND NARROWBAND TUNABILITY

(75) Inventors: Kevin J. Knopp, Newburyport, MA (US); Daryoosh Vakhshoori, Cambridge, MA (US); Masud Azimi, Belmont, MA (US); Peidong Wang, Carlisle, MA (US)

(73) Assignee: Ahura Corporation, Wilmington, MA (US)

( * ) Notice: Subject to any disclaimer, the term of this patent is extended or adjusted under 35 U.S.C. 154(b) by 383 days.

(21) Appl. No.: 10/799,304

(22) Filed: Mar. 12, 2004

(65) Prior Publication Data

US 2005/0036535 A1 Feb. 17, 2005

Related U.S. Application Data

(60) Provisional application No. 60/454,096, filed on Mar. 12, 2003, provisional application No. 60/454,037, filed on Mar. 12, 2003.

(51) Int. Cl.
*H01S 3/00* (2006.01)

(52) U.S. Cl. ...................................... 359/333; 359/344

(58) Field of Classification Search ................ 359/333, 359/344
See application file for complete search history.

(56) References Cited

U.S. PATENT DOCUMENTS 5,455,710 A * 10/1995 Takeda .................... 359/341.1
6,936,486 B2 * 8/2005 Cheng et al. ................. 438/22

* cited by examiner

*Primary Examiner*—Mark Hellner
(74) *Attorney, Agent, or Firm*—Pandiscio & Pandiscio (57) ABSTRACT

A laser source for generating amplified and filtered optical output, comprising a VCSEL, a power optical amplifier, and a filter. A laser source for generating amplified and filtered optical output, comprising a first mirror and a second mirror forming a cavity, an optical amplifier disposed in the cavity, and filter means for filtering ASE generated and amplified by the optical amplifier. A system for generating amplified and filtered optical output, comprising an optical platform having electrical connections and a fiber optic connection, a VCSEL configured to generate seed light, an optical amplifier configured to receive and amplify seed light to generate power boosted ASE and a filter configured to reduce background noise from the power boosted ASE. A method of generating optical output having high optical power with high spectral fidelity, comprising generating seed light, amplifying seed light, and filtering the amplified optical output to reduce background noise.

18 Claims, 8 Drawing Sheets

HIGH SPECTRAL FIDELITY LASER SOURCE WITH LOW FM-TO-AM CONVERSION AND NARROWBAND TUNABILITY

REFERENCE TO PENDING PRIOR PATENT APPLICATIONS

This patent application claims benefit of:

(1) pending prior U.S. Provisional Patent Application Ser. No. 60/454,096, filed Mar. 12, 2003 by Kevin J. Knopp et al. for LASER SOURCE FOR RAMAN SPECTROSCOPY APPLICATIONS; and (2) pending prior U.S. Provisional Patent Application Ser. No. 60/454,037, filed Mar. 12, 2003 by Kevin J. Knopp et al. for HIGH SPECTRAL FIDELITY LASER SOURCE WITH LOW FM-TO-AM CONVERSION AND NARROWBAND TUNABILITY The two above-identified patent applications are hereby incorporated herein by reference

FIELD OF THE INVENTION

This invention is related to laser apparatus and method in general, and more particularly to apparatus and methods for generating optical output having high optical power and high spectral fidelity.

SUMMARY OF THE INVENTION

An object of the invention is to provide a laser source having optical output with high optical power and high spectral fidelity.

Another object of the invention is to provide a co-packaged low power seed signal generator and a power optical amplifier for performance, size, and cost advantages.

A still further object is to provide a method for generating optical output power with high spectral fidelity.

With the above and other objects in view, as will hereinafter appear, there is provided a laser source for generating amplified and filtered optical output having high optical power with high spectral fidelity, the laser source comprising:

a VCSEL configured to generate seed light having a given spectral wavelength;

a power optical amplifier configured to receive the seed light generated by the VCSEL and amplify the seed light so as to generate amplified optical output having a given output power; and a filter configured to receive the amplified optical output from the power amplifier and reduce background ASE from the power optical amplifier so as to generate the amplified and filtered optical output having high optical power with high spectral fidelity.

In accordance with a further feature of the invention there is provided a laser source for generating amplified and filtered optical output having high optical power and having high spectral fidelity, the laser source comprising:

a first mirror and a second mirror forming a cavity therebetween;

an optical amplifier disposed in the cavity formed between the first mirror and the second mirror, the optical amplifier configured to generate ASE and amplify the power of the generated ASE between the first mirror and the second mirror; and filter means for filtering the ASE generated and amplified by the optical amplifier to reduce background noise therefrom so as to generate the amplified and filtered optical output laser having high optical power and high spectral fidelity.

In accordance with a further feature of the invention there is provided a system for generating amplified and filtered optical output having high optical power and high spectral fidelity, the system comprising:

an optical platform having a set of electrical connections and a fiber optic connection;

a VCSEL configured to generate seed light, and the VCSEL in electrical connection to one of the set of electrical connections of the optical platform;

an optical amplifier configured to receive the seed light generated by the VCSEL and amplify the seed light so as to generate power boosted ASE having a given output power, and the optical amplifier in electrical connection to one of the set of electrical connections of the optical platform; and a filter configured to receive the power boosted ASE from the power amplifier and reduce background noise from the power boosted ASE so as to generate an output ASE having high spectral fidelity.

In accordance with a still further feature of the invention there is provided a method of generating optical output having high optical power with high spectral fidelity, the method comprising:

generating seed light from a low power source, the seed light having a given output power and a given spectral fidelity;

amplifying the seed light source from the given output power to an amplified optical output using a power optical amplifier, the amplified optical output having an adjusted spectral fidelity and an amplified output power, and the amplified output power being greater than the given output power of the seed light; and filtering the amplified optical output produced by the optical amplifier to reduce background noise therein so as to generate the amplified and filtered optical output having high spectral fidelity greater than the adjusted spectral fidelity of the power boosted ASE.

The above and other features of the invention, including various novel details of construction and combinations of parts and method steps will not be more particularly described with reference to the accompanying drawings and pointed out in the claims. It will be understood that the particular devices and method steps embodying the invention are shown by way of illustration only and not as limitations of the invention. The principles and features of this invention may be employed in various and numerous embodiments without departing from the scope of the invention.

BRIEF DESCRIPTION OF THE DRAWINGS

These and other objects and features of the present invention will be more fully disclosed or rendered obvious by the following detailed description of the preferred embodiments of the invention, which are to be considered together with the accompanying drawings wherein like numbers refer to like parts, and further wherein.

DETAILED DESCRIPTION OF THE PREFERRED EMBODIMENTS

Figure 1:
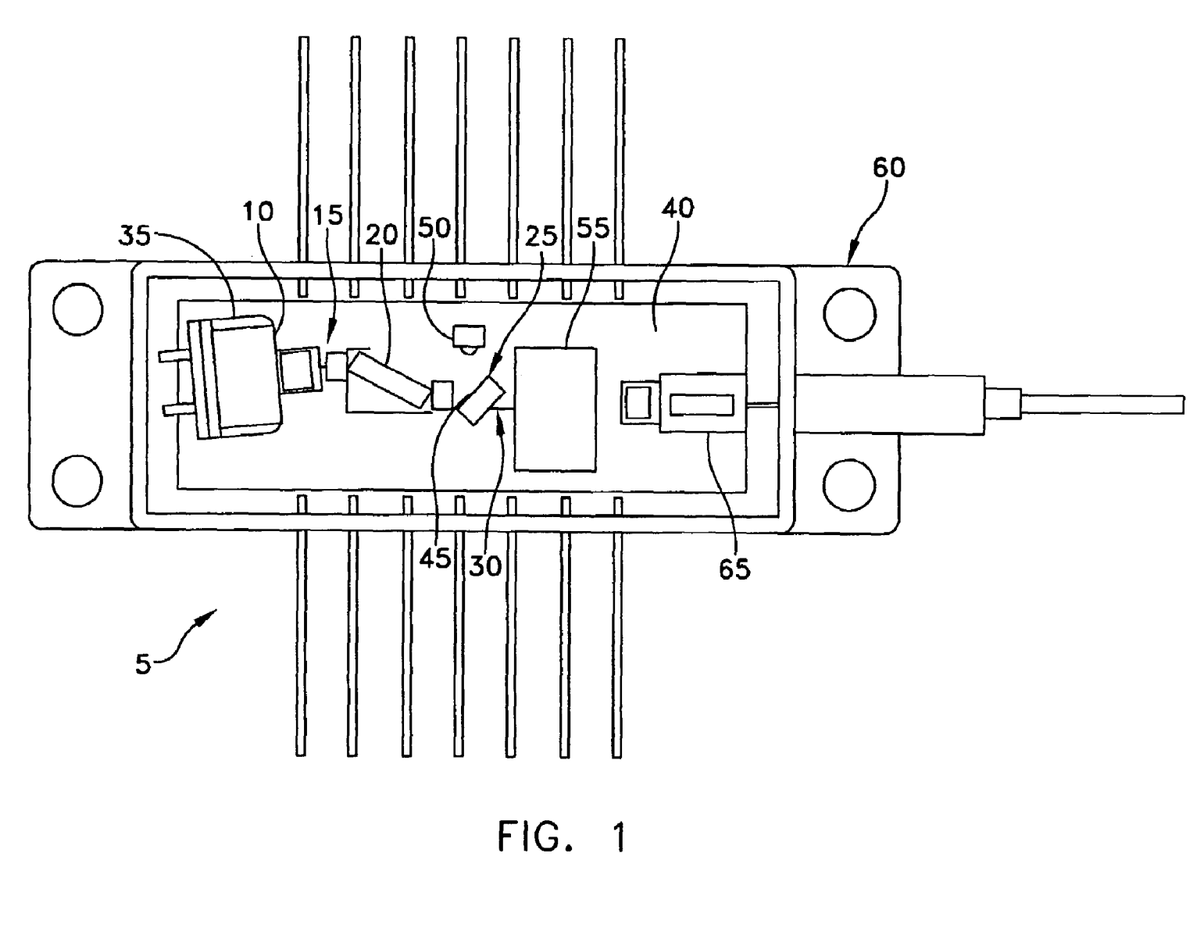
FIG. 1 is a schematic diagram of a laser source of a preferred embodiment of the present invention.

At the foundation of the present invention is a novel co-packaged seeded power optical amplifier (CP-SPOA) technology. Referring to FIG. 1, and in a preferred embodiment of the present invention, this novel technology comprises a co-packaged source module 5 which couples a low-power source 10 providing a seed optical signal 15 having the desired spectral characteristics into a long-cavity semiconductor waveguide 20 for power amplification. This co-packaged approach has tremendous advantages in performance, size, and cost. Some of these advantages of this technical platform include (1) design optimizations in that spectral and power performance are orthogonal, (2) higher yield from co-packaging rather than monolithic integration, (3) independent controls for spectral adjustments and power adjustments, and (4) compatibility with reliable telcom qualified packaging techniques.

The novel technology of the present invention is ideal for spectroscopy applications where a laser source's spectral fidelity, wavelength accuracy, AM-to-FM conversion ratio, output power, and reliability are primary concerns.

In addition, the present invention allows scalability to higher output powers without compromise of spectral performance.

Overview of Technical Approach

Figure 8:
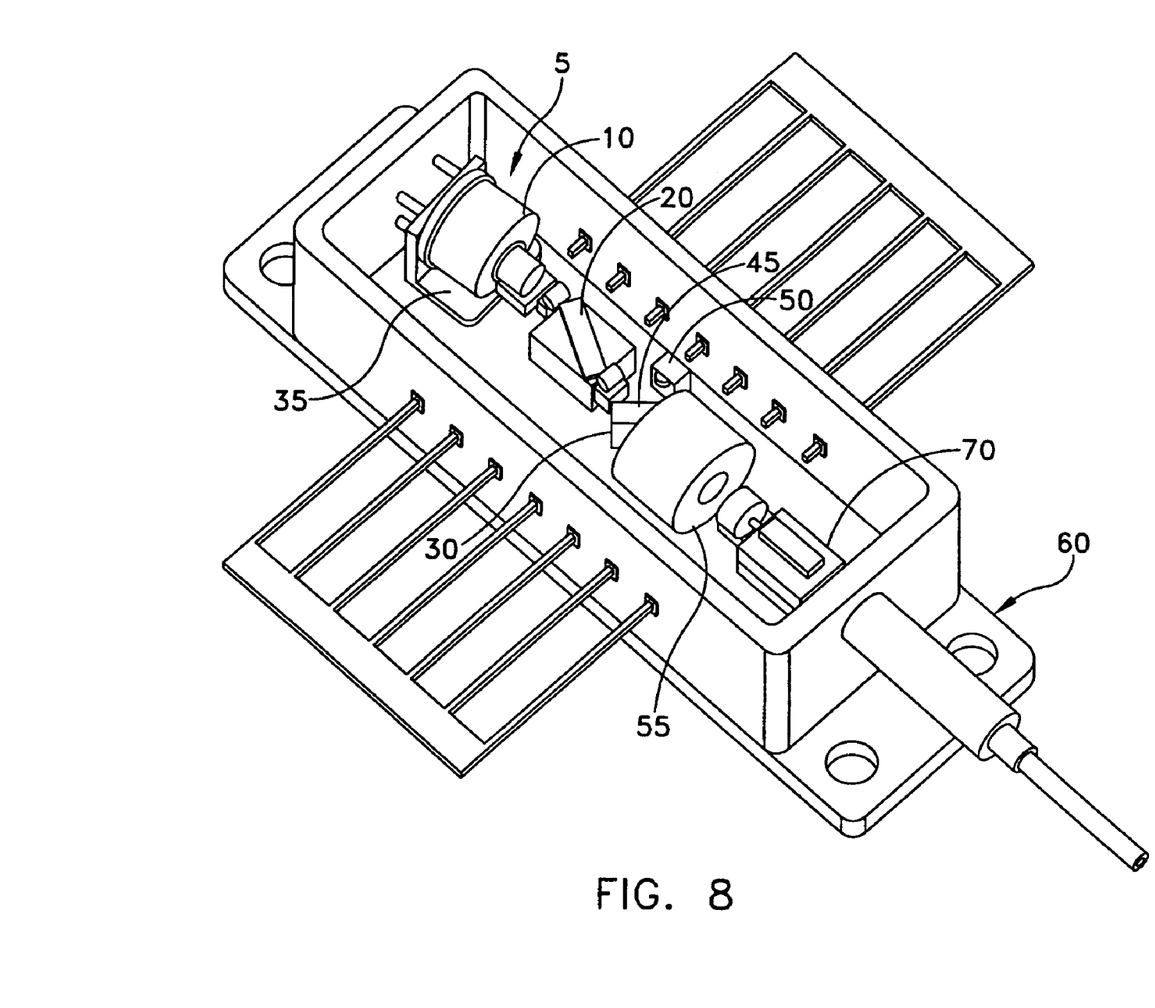
FIG. 8 is a schematic diagram of a perspective view of the laser source shown in FIG. 7.

A schematic representation of a preferred embodiment of the present invention includes CP-SPOA source module 5 shown in FIG. 1. Seed light 15 is generated from a low-power VCSEL 10 which is then coupled into a power optical amplifier 20. A TEC 35 is thermally connected with the VCSEL 10 to set the absolute wavelength of source module 5. A second TEC 40 is used to maintain the temperature of the optical platform. A thin-film tap 45 and photodetector 50 provide power monitoring functionality so as to maintain output power stability of the source module 5. An isolator 55 may be used to provide high optical return loss. The entire optical train is preferably contained in a 14-pin hermetically-sealed butterfly package 60 with either a multi-mode fiber pigtail 65 or a single-mode fiber pigtail 70 (FIGS. 8 and 9).

Figure 2:
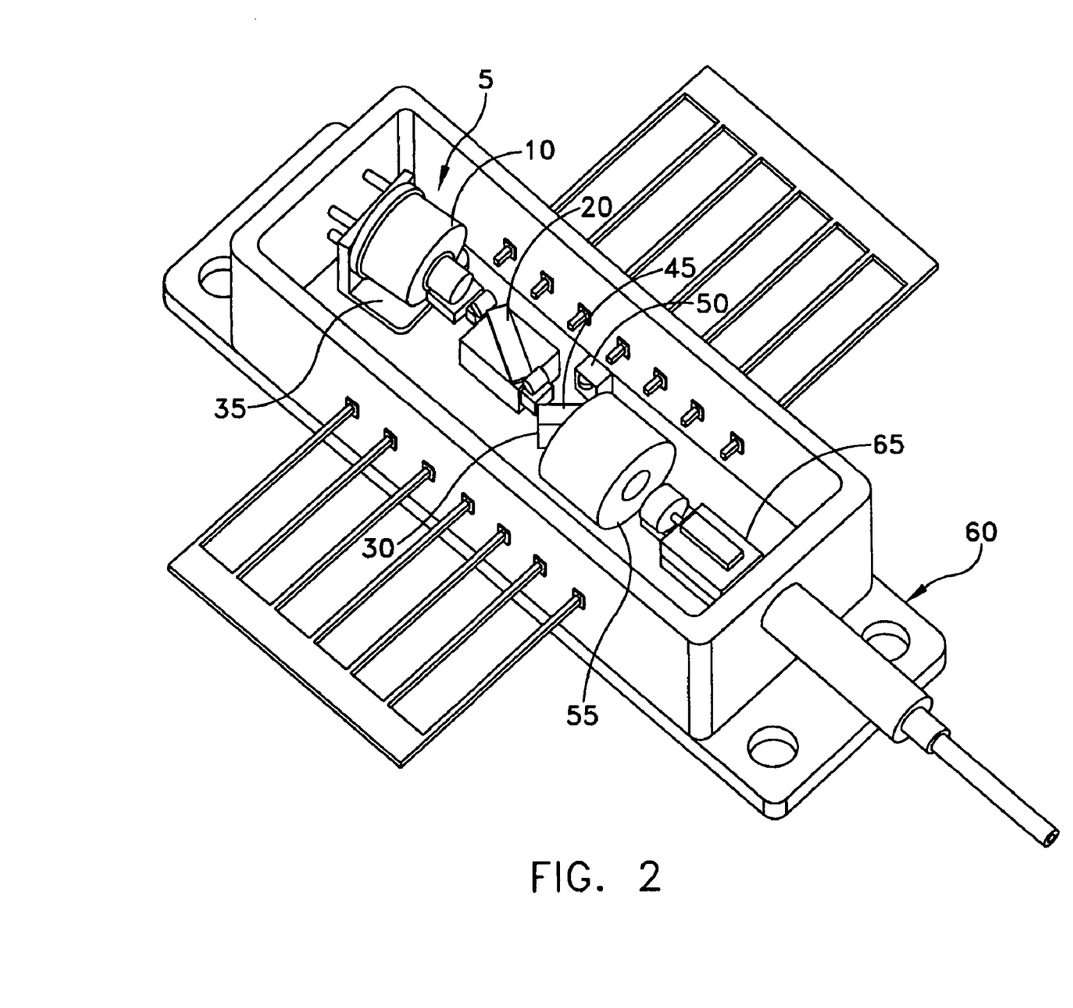
FIG. 2 is a schematic diagram of a perspective view of the laser source shown in FIG. 1.

FIG. 2 illustrates a preferred optical layout design within hermitically sealed butterfly package 60. VCSEL light 15 provides the high spectral fidelity single longitudinal mode required for the seed signal. In a preferred embodiment of the present invention, seed light 15 has a side mode suppression ratio (SMSR) of greater than 20 dB and a linewidth of less than 100 MHz. In another preferred embodiment of the present invention, seed light 15 has a SMSR of greater than 30 dB and a line width of less than 10 MHz. Power optical amplifier 20 serves to boost seed light 15 to a desired output power. For example, the power of seed signal 15 may be boosted from 10 mW to 1 W. Superb wavelength stability is fundamentally achieved through the reliance on the stability of the optical index of the semiconductor cavity in a similar manner as a conventional Telecom grade DFB laser. The current to power optical amplifier 20 can be adjusted so as to control output power independent to spectral wavelength.

A filter 25 disposed within source module 5 reduces background noise from optical signal 20 so as to produce an optical output 30 having high power output and high spectral fidelity.

The output wavelength can be dynamically tuned through modulation of the seed current or through adjustment of the setpoint of seed TEC 35. The FM-AM conversion experienced during tuning will be minimized through the use of a VCSEL as the seed and through saturation of the power optical amplifier. The estimated AM/FM ratio for the proposed device is ~0.5%/GHz as opposed to ~5%/GHz for a typical DFB solution.

The independence of the output power of the optical amplifier with respect to the spectral wavelength of the seed light enables the use of various "lock-in" techniques or modulation techniques and can also eliminate mechanical shutter. In a preferred embodiment of the present invention, filter 25 is a multicavity thin-film filter configured at the output of the laser source so as to reduce the background ASE from the laser emission by the greater than 70 dB, which in turn allows-potential detection of weaker Raman signals. Additionally, the single longitudinal mode nature of the seed source signal allows the elimination of Raman "ghost" signals.

In a preferred embodiment of the present invention, an optical platform and thermoelectric cooler (TEC) combination 40 supports and thermally regulates power optical amplifier 20 and filter 25.

Figure 3A:
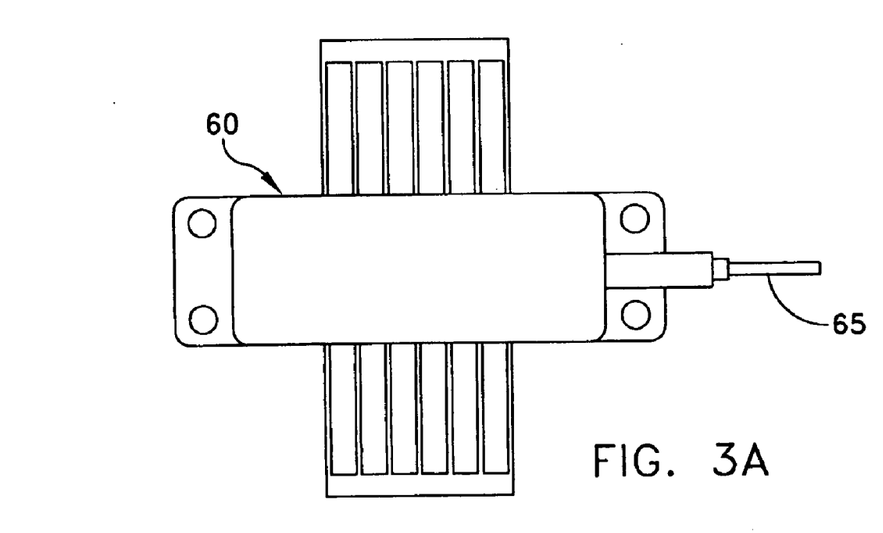
FIGS. 3A, 3B and 3C are a diagrammatic view, a side diagrammatic view and an end diagrammatic view of the laser source shown in FIG. 1, respectively.
Figure 3B:
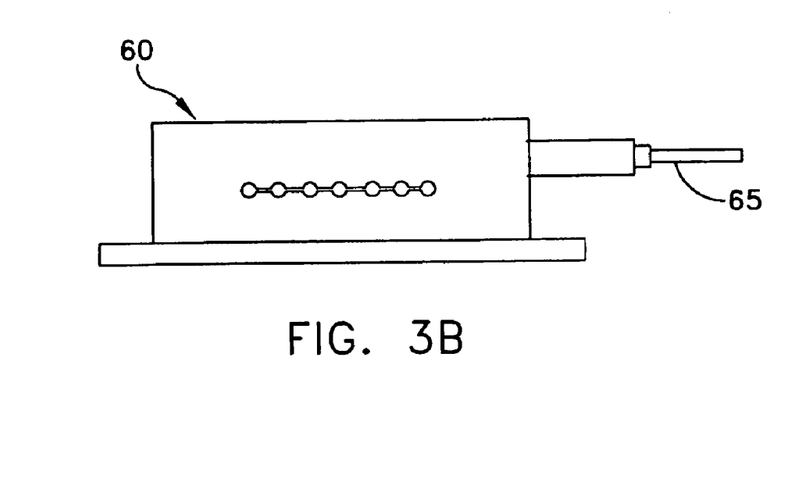
Figure 3C:
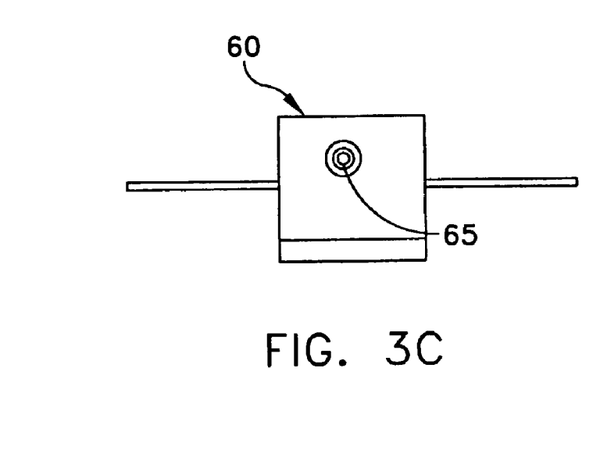

Referring to FIGS. 1–3, and in a preferred embodiment of the present invention, there is shown a schematic representation of a source module 5 having a co-packaged seeded power-optical amplifier (CP-SPOA) 5 (FIG. 1), a 3-D rendering of a hermetically-sealed laser source module with the lid removed (FIG. 2), and a dimensional layout of the hermetically-sealed laser source module 5 with illustrative dimensions in mm (FIG. 3).

Laser Source Subsystem

Figure 4:
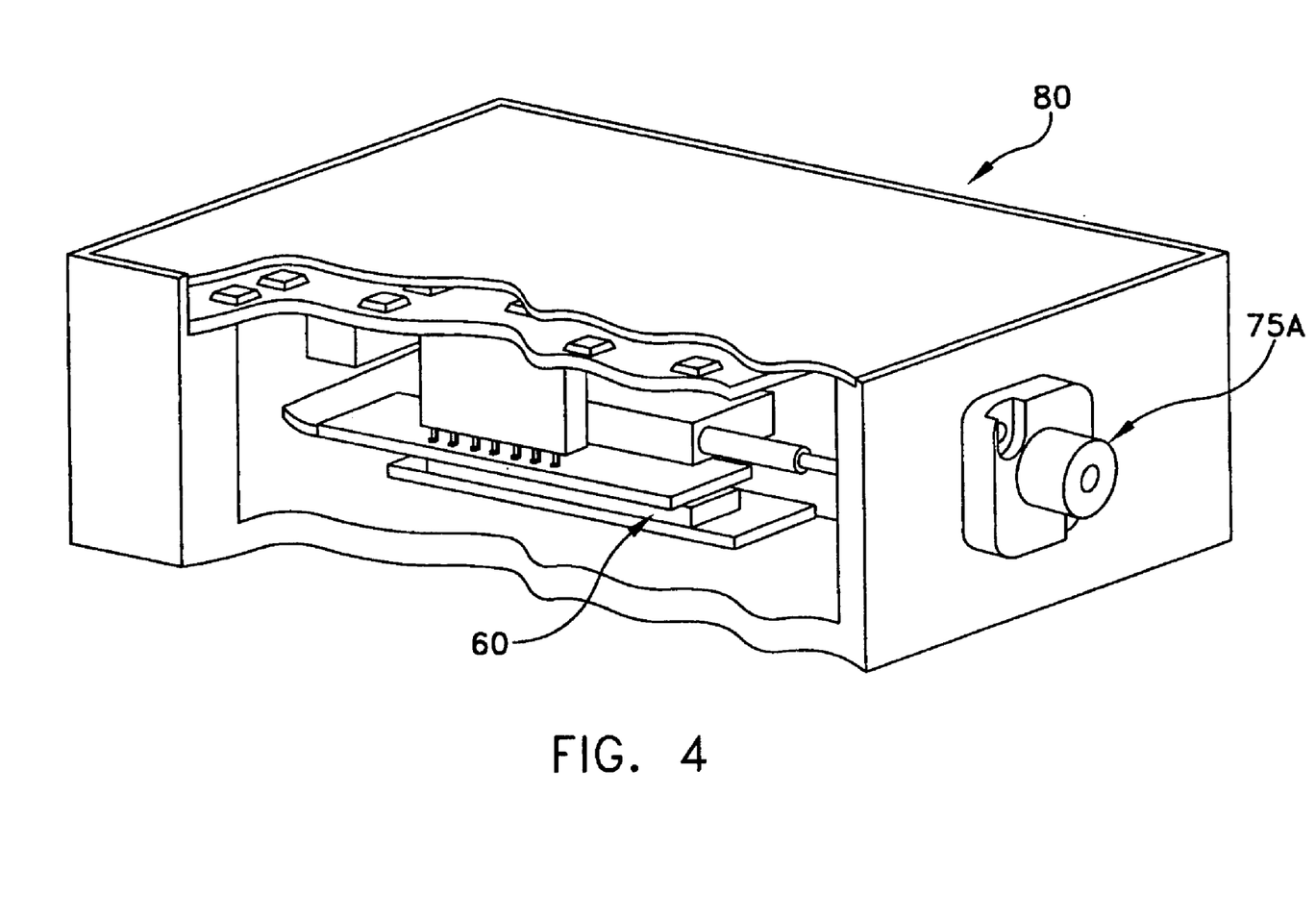
FIG. 4 is a schematic diagram of an optical component comprising the laser source of FIG. 1 together with an electrical connector (not shown) and an optical fiber connector.
Figure 5A:
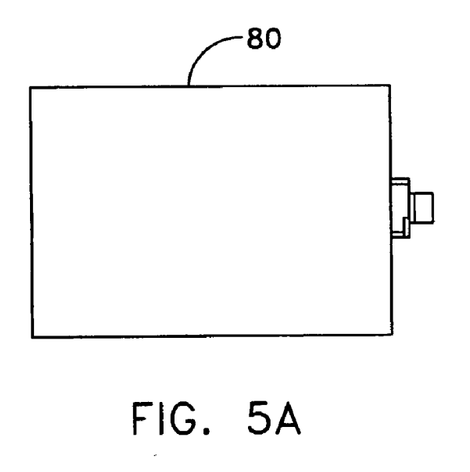
FIGS. 5A–5D are a top diagrammatic view, a side diagrammatic view, and an end diagrammatic view of the optical component shown in FIG. 4.
Figure 5B:
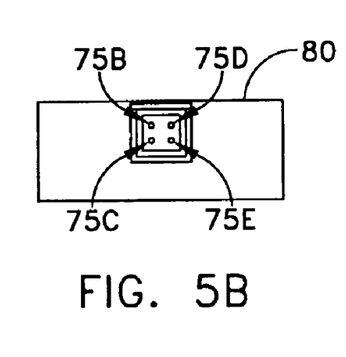
Figure 5C:
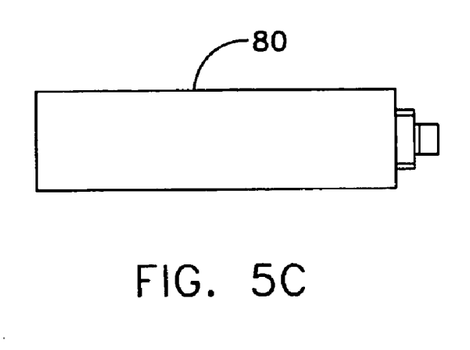
Figure 5D:
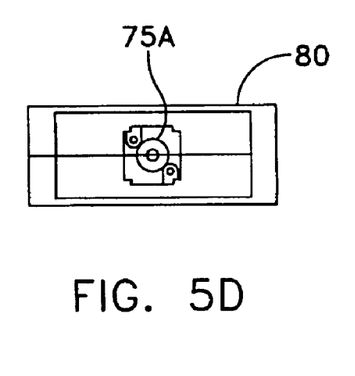

Referring now to FIG. 4, and in a preferred embodiment of the present invention, source module 5 is integrated with driver electronics 75A–75E to create a laser source component 80. A rendering of the complete laser source component 80 is shown in FIG. 4. In FIG. 5, there is shown a dimensional layout of laser source component 80. Laser source component 80 has an SMA fiber connector output 75A and four electrical connections: a 5V supply voltage 75B, a laser set-point input voltage 75C, an output voltage proportional to the output optical power 75D, and a ground pin 75E. Component 80 operates to provide the output power in a constant power mode using an analog feedback loop for exceptional power stability over life. In FIG. 4, there is a schematic rendering of the laser source component 80 with a cut-away shown. In FIGS. 5A–5D, there is a dimensional layout of the laser source component 80 with the dimensions shown in inches.

Optical Performance Specifications

In a preferred embodiment of the present invention, laser source module 5 conforms to the performance criteria outlined in Table 1 over its life in the environmental conditions specified in Table 4. The specifications for the final product, alpha prototypes, and beta units are listed.

Table 1 specifies preferred optical performance specifications achieved prior to end of life (EOL) of the laser source module 5; however, it should be appreciated that this table is provided by way of example only and not by way of limitation.

| Parameter | Unit | Min | Typical | Max | α | β | Final Product |
|---|---|---|---|---|---|---|---|
| Output Optical Power | mW | 300 | 350 | | ✓ | ✓ | ✓ |
| Output Power Stability[1] | % | | 0.5 | 2 | ✓ | ✓ | ✓ |
| Wavelength | nm | 782.0 | 785.0 | 788.0 | ✓ | ✓ | ✓ |
| Peak Wavelength Stability[2] | nm | | <0.01 | 0.1 | | ✓ | ✓ |
| Number of Longitudinal Modes | # | | | Single Mode | ✓ | ✓ | ✓ |
| Laser Line Width | MHz | | 3 | 10 | ✓ | ✓ | ✓ |
| Side Mode Suppression Ratio | dB | 25 | 30 | | ✓ | ✓ | ✓ |
| Optical Signal-to-Noise Ratio[3] | dB | 40 | 45 | | ✓ | ✓ | ✓ |
| Width of ASE Suppression Filter | nm (FW@ 70 dB) | | | 4 | | ✓ | ✓ |
| ASE Suppression | dB | 70 | 80 | | | ✓ | ✓ |
| Relative Intensity Noise | dB/Hz | | | −100 f < 1 GHz | | ✓ | ✓ |

Figure 6:
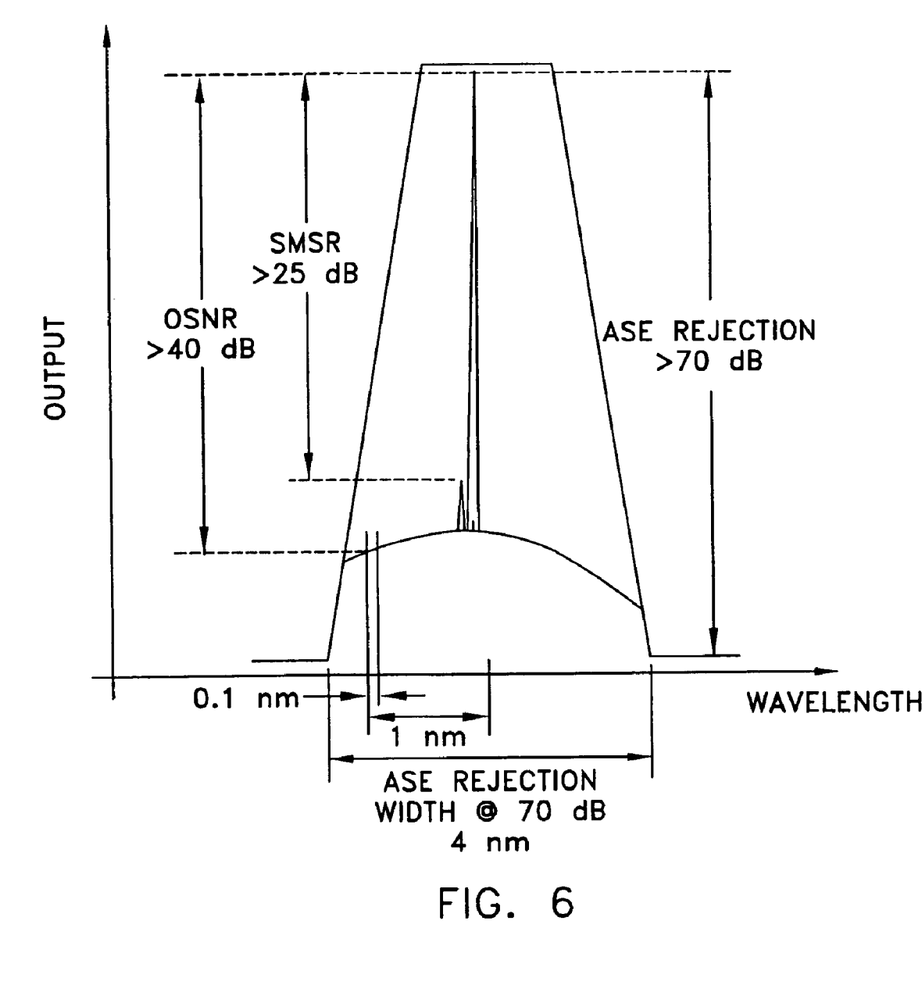
FIG. 6 is a diagrammatic illustration of the spectral properties of the laser source shown in FIG. 1.
Figure 7:
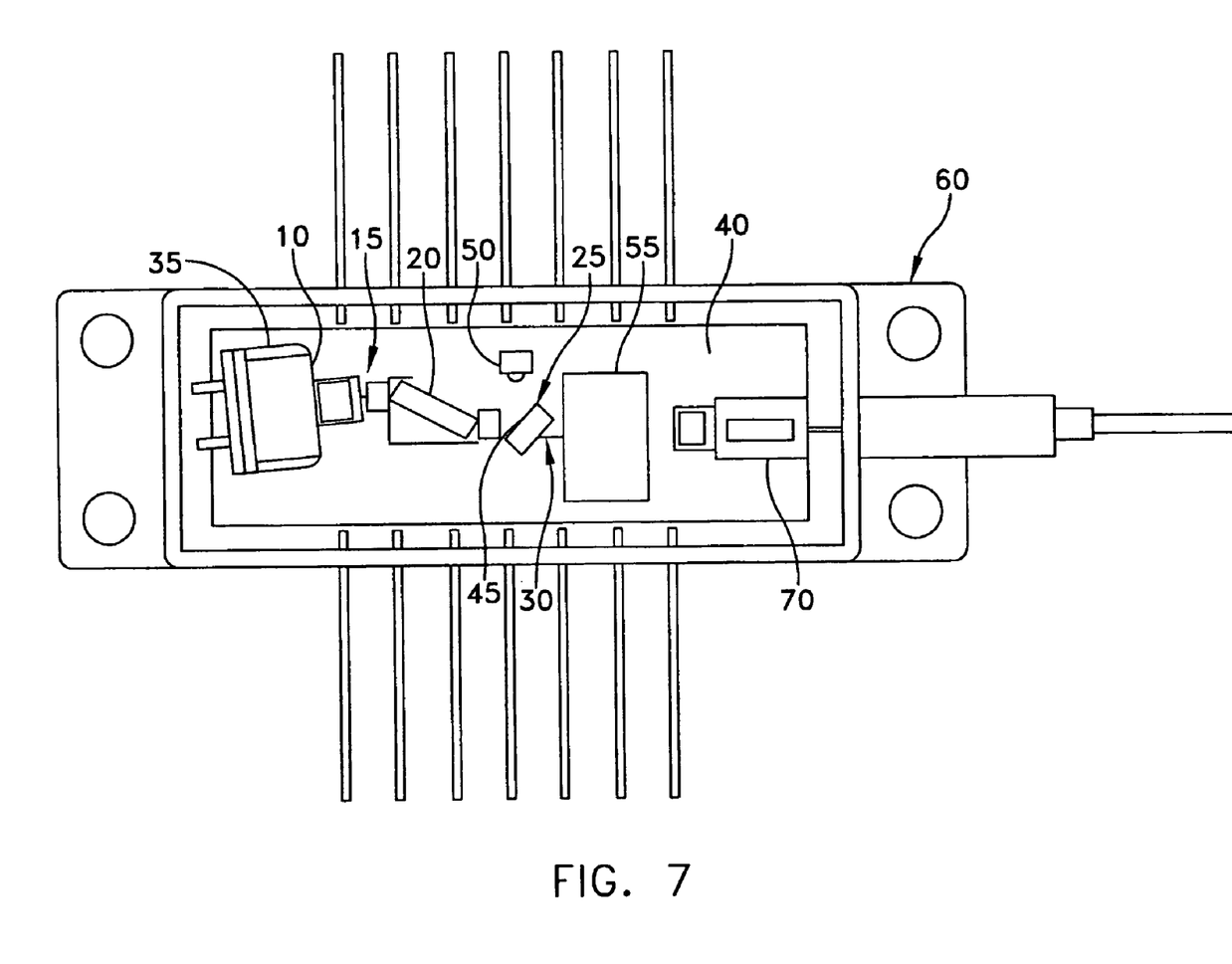
FIG. 7 is a schematic diagram of another preferred embodiment of the present invention with a laser source coupled to a SMF fiber.

[1]High stability is provided via a closed loop analog feedback loop with a time constant of >100 kHz.
[2]Maximum change in wavelength from start-of-life through end-of-life across temperatures. Over a typical 8 hour time period the wavelength will have maximum drifts of <<0.01 nm.
[3]Measured 1 nm away from the peak with a resolution bandwidth of 0.1 nm A depiction of the definitions of the spectral properties of module 5 is shown in FIG. 6. As shown, a thin-film multi-cavity filter is used to suppress the ASE background emission of the laser source by >70 dB.

Mechanical Assembly

In a preferred embodiment of the present invention, the laser source module has the mechanical attributes as specified in Table 2 for the final product, alpha prototypes, and beta units.

Table 2 specifies preferred mechanical attributes of the laser source module 5; however, it should be appreciated that this table is provided by way of example only and not by way of limitation.

| Parameter | Unit | Value | α | β | Final Product |
|---|---|---|---|---|---|
| Fiber Connector | Type | SMA for 50 µm MMF | ✓ | ✓ | ✓ |
| Electrical Connector | Type | 4-pin | ✓ | ✓ | ✓ |
| Case Material | Type | Anodized Aluminum | ✓ | ✓ | ✓ |
| Dimensions of the Subsystem | inch | 2.5 × 3.5 × 1.125 | ✓ | ✓ | ✓ |

Electrical Specifications

In a preferred embodiment of the present invention, laser source module 5 has electrical requirements as specified in Table 3 for the final product, alpha prototypes, and beta units.

Table 3 specifies preferred electrical requirements of the laser source module 5; however, it should be appreciated that this table is provided by way of example only and not by way of limitation.

| Parameter | Unit | Min | Typical | Max | α | β | Final Product |
|---|---|---|---|---|---|---|---|
| Subsystem Supply | V | 4.8 | 5 | 5.2 | ✓ | ✓ | ✓ |
| Input | A | | 0.8 | 1.2 | ✓ | ✓ | ✓ |
| Laser Set-Point Control Voltage | mV/mW | | 10 | | | ✓ | ✓ |
| Power Monitor Output Voltage | mV/mW | | 10 | | | ✓ | ✓ |
| Output Power Slew Rate[4] | Hz | 10 | | | | ✓ | ✓ |
| Output Power Feedback Response[5] | kHz | 100 | | | | ✓ | ✓ |
| Power Consumption[6] | W | | 4 | 6 | | ✓ | ✓ |

[4]The output optical power will be updated in response to a change in set-point voltage at a rate of 10 Hz.
[5]The output optical power will be controlled in a constant power loop updated at a rate >100 kHz.
[6]Maximum power consumption when operating the subsystem at a case temperature of 40° C./0° C.

Environmental Conditions

The environmental operating conditions for the laser source component 80 are shown in Table 4. The heat dissipated from laser source 5 and TEC 40 within the optical package must be dissipated through mating of optical module 5 to an appropriate heat sink.

Table 4 specifies preferred environmental operating conditions for the laser source module 5; however, it should be appreciated that this table is provided by way of example only and not by way of limitation.

| Parameter | Unit | Value | α | β | Final Product |
|---|---|---|---|---|---|
| Operating Temperature | ° C. | 0 to 40 | | ✓ | ✓ |
| Storage Temperature Range | ° C. | −40 to 80 | | ✓ | ✓ |

Laser Source Module

Laser source module 5 as shown in FIG. 2 is the heart of component 80. Module 5 is contained within the mechanical assembly of component 80. Specifications on the performance of laser source module 5 are presented herein below. Most of these parameters are internal to the subsystem and are invisible to the end user.

Optical Performance Specifications

Laser source module 5 has the performance criteria outlined in Table 1 over its life in the environmental conditions specified in Table 7. The optical specifications of module 5 are identical to that for component 80 with the exception that an increased output power (+0.2 dB) is required to budget for connector loss and aging of the SMA.

Mechanical Assembly

The mechanical attributes of the laser source module are specified in Table 5 for the final product, alpha prototypes, and beta units.

Table 5 specifies preferred mechanical attributes of laser source module 5; however, it should be appreciated that this table is provided by way of example only and not by way of limitation.

| Parameter | Unit | Value | α | β | Final Product |
|---|---|---|---|---|---|
| Fiber Type | Type | 50 μm MMF | ✓ | ✓ | ✓ |
| Fiber Connector | Type | SMA | ✓ | ✓ | ✓ |
| Fiber Pigtail Length | m | 1 | | ✓ | ✓ |
| Package Style of Optical Module | Type | 14-Pin Butterfly | ✓ | ✓ | ✓ |
| Dimensions of Optical Module | mm | 42 × 12 × 13 | | ✓ | ✓ |
| Sealing of Optical Module | Type | Hermetic | | ✓ | ✓ |

Electrical Specifications

The electrical requirements of the laser source module 5 are specified in Table 6 for the final product, alpha prototypes, and beta units.

Table 6 provides preferred electrical requirements of the laser source module 5; however, it should be appreciated that this table is provided by way of example only and not by way of limitation.

| Parameter | Unit | Min | Typical | Max | α | β | Final Product |
|---|---|---|---|---|---|---|---|
| Seed Laser Driver | V | 0 | 3 | 4 | | ✓ | ✓ |
| | mA | 0 | 5 | 20 | | ✓ | ✓ |
| POA Current Driver | V | 0 | 2 | 2.3 | | ✓ | ✓ |
| | A | 0 | 1.0 | 1.5 | | ✓ | ✓ |
| POA TEC Driver | V | −1.5 | 0.4 | 1.5 | | ✓ | ✓ |
| | A | −1.5 | 0.7 | 1.5 | | ✓ | ✓ |
| Power Dissipation[7] | W | | 3.5 | 5 | | ✓ | ✓ |
| POA Thermistor Resistance (@ 25° C.) | kΩ | 9.5 | 10 | 10.5 | ✓ | ✓ | ✓ |
| Monitor Photodiode Dark Current ($V_{reverse}$ = 5 V) | nA | | | 100 | | ✓ | ✓ |
| Signal Power Monitor Responsivity ($V_{reverse}$ = 5 V) | μA/mW | 3.8 | 4 | 4.2 | | ✓ | ✓ |

[7]Total Power Consumption with TEC at the highest/lowest operating case temperature.

Environmental Conditions

The environmental operating conditions are shown in Table 7. The heat dissipated from laser source 5 and TEC 35 within the optical module must be dissipated through mating of laser component 80 to an appropriate heat sink. There is a 5° temperature differential between the case of component 80 and the case of module 5.

Table 7 specifies preferred environmental conditions for the laser source module 5; however, it should be appreciated that this table is provided by way of example only and not by way of limitation.

| Parameter | Unit | Value | α | β | Final Product |
|---|---|---|---|---|---|
| Operating Temperature | ° C. | 5 to 45 | | ✓ | ✓ |
| Storage Temperature Range | ° C. | −40 to 80 | | ✓ | ✓ |
| Operating Humidity Range | % | 0 to 90 | | ✓ | ✓ |

Qualification

The proposed laser source subsystem will be shown to have a mean time to failure (MTTF) of greater than 10,000 hours. End of life (EOL) has occurred when the specifications of Table 1 can no longer be met. Processes and techniques compatible with Telcordia qualification standards may be used to ensure reliable operation. Qualification testing preferably includes checks related to aging, storage, damp-heat, thermal cycling, and mechanical shock/vibration. Other tests will be performed as needed to ensure product quality.

What is claimed is:

1. A laser source for generating amplified and filtered optical output having high optical power with high spectral fidelity, the laser source comprising:
    a VCSEL configured to generate seed light having a given spectral wavelength;
    a power optical amplifier configured to receive the seed light generated by the VCSEL and amplify the seed light so as to generate amplified optical output having a given output power; and
    a filter configured to receive the amplified optical output from the power amplifier and reduce background ASE from the power optical amplifier so as to generate the amplified and filtered optical output having high optical power with high spectral fidelity;
    wherein the VCSEL provides seed light having a side mode suppression ratio of greater than 20 dB and a line width of less than 100 MHz.

2. A laser source according to claim 1 wherein the given output power generated by the power optical amplifier is in a range of about 10 mW to 1 W.

3. A laser source for generating amplified and filtered optical output having high optical power with high spectral fidelity, the laser source comprising:
    a VCSEL configured to generate seed light having a given spectral wavelength;
    a power optical amplifier configured to receive the seed light generated by the VCSEL and amplify the seed light so as to generate amplified optical output having a given output power; and
    a filter configured to receive the amplified optical output from the power amplifier and reduce background ASE from the power optical amplifier so as to generate the amplified and filtered optical output having high optical power with high spectral fidelity;
    further comprising a thermoelectric cooler (TEC) in thermal connection with the VCSEL, wherein the TEC adjusts the temperature of the VCSEL so as to set the absolute wavelength of the seed light generated by the VCSEL.

4. A laser source according to claim 3 further comprising an additional thermoelectric cooler (TEC) in thermal connection with at least one of the optical amplifier and the filter.

5. A laser source for generating amplified and filtered optical output having high optical power with high spectral fidelity, the laser source comprising:
    a VCSEL configured to generate seed light having a given spectral wavelength;
    a power optical amplifier configured to receive the seed light generated by the VCSEL and amplify the seed light so as to generate amplified optical output having a given output power; and
    a filter configured to receive the amplified optical output from the power amplifier and reduce background ASE from the power optical amplifier so as to generate the amplified and filtered optical output having high optical power with high spectral fidelity;

further comprising a thin-film tap and a photodetector disposed subsequent to the optical amplifier so as to monitor the given output power.

6. A laser source according to claim 5 further comprising an isolator positioned to receive the amplified and filtered optical output therethrough so as to provide high optical return loss.

7. A laser source for generating amplified and filtered optical output having high optical power with high spectral fidelity, the laser source comprising:
   a VCSEL configured to generate seed light having a given spectral wavelength;
   a power optical amplifier configured to receive the seed light generated by the VCSEL and amplify the seed light so as to generate amplified optical output having a given output power; and
   a filter configured to receive the amplified optical output from the power amplifier and reduce background ASE from the power optical amplifier so as to generate the amplified and filtered optical output having high optical power with high spectral fidelity;
   further comprising power optical amplifier adjustment means for adjusting a given magnitude of electrical current applied to the power optical amplifier so as to control the given output power of the amplified and filtered optical output based on the given magnitude of the electrical current applied to the power optical amplifier.

8. A laser source according to claim 7 wherein the given output power of the amplified optical output is selected by adjusting the given magnitude of the electrical current applied to the optical amplifier independent of the given spectral wavelength of the seed.

9. A laser source for generating amplified and filtered optical output having high optical power with high spectral fidelity, the laser source comprising:
   a VCSEL configured to generate seed light having a given spectral wavelength;
   a power optical amplifier configured to receive the seed light generated by the VCSEL and amplify the seed light so as to generate amplified optical output having a given output power; and
   a filter configured to receive the amplified optical output from the power amplifier and reduce background ASE from the power optical amplifier so as to generate the amplified and filtered optical output having high optical power with high spectral fidelity;
   further comprising VCSEL adjustment means for adjusting a given magnitude of electrical current applied to the VCSEL so as to modulate the seed light from a particular spectral wavelength to the given wavelength and so as to control the given spectral wavelength of the amplified and filtered optical output based on the given wavelength of the seed light.

10. A laser source according to claim 9 wherein the power optical amplifier is a semiconductor optical amplifier.

11. A laser source for generating amplified and filtered optical output having high optical power with high spectral fidelity, the laser source comprising:
   a VCSEL configured to generate seed light having a given spectral wavelength;
   a power optical amplifier configured to receive the seed light generated by the VCSEL and amplify the seed light so as to generate amplified optical output having a given output power; and
   a filter configured to receive the amplified optical output from the power amplifier and reduce background ASE from the power optical amplifier so as to generate the amplified and filtered optical output having high optical power with high spectral fidelity;
   wherein the seed light has a side mode suppression ratio (SMSR) of less than 30 dB and a linewidth of greater than 10 MHz.

12. A laser source for generating amplified and filtered optical output having high optical power with high spectral fidelity, the laser source comprising:
   a VCSEL configured to generate seed light having a given spectral wavelength;
   a power optical amplifier configured to receive the seed light generated by the VCSEL and amplify the seed light so as to generate amplified optical output having a given output power; and
   a filter configured to receive the amplified optical output from the power amplifier and reduce background ASE from the power optical amplifier so as to generate the amplified and filtered optical output having high optical power with high spectral fidelity;
   wherein the filter is a multi-cavity thin filter configured to reduce background ASE from the power optical amplifier by about 25 dB.

13. A laser source for generating amplified and filtered optical output having high optical power and having high spectral fidelity, the laser source comprising:
   a first mirror and a second mirror forming a cavity therebetween;
   an optical amplifier disposed in the cavity formed between the first mirror and the second mirror, the optical amplifier configured to generate ASE and amplify the power of the generated ASE between the first mirror and the second mirror; and
   filter means for filtering the ASE generated and amplified by the optical amplifier to reduce background noise therefrom so as to generate the amplified and filtered optical output laser having high optical power and high spectral fidelity.

14. A laser source according to claim 13 wherein the first mirror is a wavelength selective mirror.

15. A laser source according to claim 14 wherein the wavelength selective mirror is a grating.

16. A laser source according to claim 15 wherein the second mirror is configured to selectively transmit the output to an optical fiber.

17. A method of generating optical output having high optical power with high spectral fidelity, the method comprising:
   generating seed light from a low power source, the seed light having a given output power and a given spectral fidelity;
   amplifying the seed light source from the given output power to an amplified optical output using a power optical amplifier, the amplified optical output having an adjusted spectral fidelity and an amplified output power, and the amplified output power being greater than the given output power of the seed light; and
   filtering the amplified optical output produced by the optical amplifier to reduce background noise therein so as to generate the amplified and filtered optical output having high spectral fidelity greater than the adjusted spectral fidelity of the power boosted ASE;
   wherein the high spectral fidelity of the amplified and filtered optical output is substantially equal to the given spectral fidelity of the seed light produced by the low power source.

18. A method of generating optical output having high optical power with high spectral fidelity, the method comprising:

generating seed light from a low power source, the seed light having a given output power and a given spectral fidelity;

amplifying the seed light source from the given output power to an amplified optical output using a power optical amplifier, the amplified optical output having an adjusted spectral fidelity and an amplified output power, and the amplified output power being greater than the given output power of the seed light; and filtering the amplified optical output produced by the optical amplifier to reduce background noise therein so as to generate the amplified and filtered optical output having high spectral fidelity greater than the adjusted spectral fidelity of the power boosted ASE;

wherein the high spectral fidelity of the amplified and filtered optical output exceeds the given spectral fidelity of the seed light produced by the low power source.

* * * * *